(12) United States Patent
Gattiker et al.

(10) Patent No.: US 7,127,690 B2
(45) Date of Patent: Oct. 24, 2006

(54) METHOD AND SYSTEM FOR DEFECT EVALUATION USING QUIESCENT POWER PLANE CURRENT (IDDQ) VOLTAGE LINEARITY

(75) Inventors: Anne Elizabeth Gattiker, Austin, TX (US); Phillip J. Nigh, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 286 days.

(21) Appl. No.: 10/728,172

(22) Filed: Dec. 3, 2003

(65) Prior Publication Data

US 2005/0125711 A1   Jun. 9, 2005

(51) Int. Cl.
*G06F 17/50* (2006.01)
*G01R 19/00* (2006.01)
*G01R 31/26* (2006.01)

(52) U.S. Cl. .............................. 716/5; 702/64; 324/765
(58) Field of Classification Search ..................... None
See application file for complete search history.

(56) References Cited

U.S. PATENT DOCUMENTS

| | | | | |
|---|---|---|---|---|
| 5,467,291 A | * | 11/1995 | Fan et al. | 703/14 |
| 6,140,832 A | * | 10/2000 | Vu et al. | 324/765 |
| 6,184,048 B1 | * | 2/2001 | Ramon | 438/14 |
| 6,574,760 B1 | * | 6/2003 | Mydill | 714/724 |
| 6,801,049 B1 | * | 10/2004 | Ishida et al. | 324/765 |
| 6,941,235 B1 | * | 9/2005 | Gattiker | 702/64 |

OTHER PUBLICATIONS

Gattiker et al., "Current Signatures," 14th VLSI Test Symposium, IEEE 1996, pp. 112-117.*

Maxwell et al., "Current Ratios: A Self-Scaling Technique for Production IDDQ Testing," ITC Int'l Test Conference, IEEE 1999, pp. 738-746.*

Miller et al., "IDDQ Testing in Deep Submicron ICs," ITC Int'l Test Conference, IEEE 1999, pp. 724-729.*

Soden et al., "IDDQ Testing and Defect Classes—A Tutorial," IEEE 1995 Custom ICs Conference, pp. 633-642.*

Jonathan T-Y Chang & Edward J. McCluskey Quantitative Analysis of Very-Low-Voltage Testing, 1996.

Jonathan T-Y Chang, Chao-Wen Tseng, Yi-Chin, Sanjay Wattal, Mike Purtell and Edward McCluskey Experiemental results for IDDQ and VLV Testing.

(Continued)

*Primary Examiner*—Leigh M. Garbowski
(74) *Attorney, Agent, or Firm*—Mitch Harris; Andrew M. Harris; Casimer K. Salys (57) ABSTRACT

A method and system for defect evaluation using IDDQ voltage linearity provides improved IDDQ testing for determining whether manufacturing defects in a VLSI device are likely to cause functional faults. IDDQ data is collected at multiple power plane voltages (VDDs) for a test vector at which a fault is activated. The IDDQ vs. VDD is then examined and a range of VDDs over which the characteristic IDDQs are non-linear with respect to VDD is determined. Peaks in the first derivative of the IDDQ vs. VDD curve indicate a particular VDD at which the onset of non-linearity in the IDDQ occurs. The VDD point below which the curve is non-linear indicates the relative resistance of a fault with respect to the driving point resistance of the node at which the fault is located. The relative resistance is directly determinative of additional circuit delay cause by the fault and/or whether the fault will cause a logic level transmission failure. Therefore, the range of VDDs for which the IDDQ curve is linear provides a pass/fail indication that can be used to reject devices in manufacturing test.

18 Claims, 5 Drawing Sheets

OTHER PUBLICATIONS

R. Rodriguiz-Montanes, J. Figuerias Bridges in Sequential CMOS Circuits: Current-Voltage Signature, 1997.

R. Rodriguiz-Montanes, J. Figuerias IDDQ-VDD Signatures for CMOS Circuits with Bridging Defects, 1996.

Anne Gattiker, Phil Nigh, and Thomas Vogels IC Testing: Background, Directions and Opportunities for Failure Analysis.

Hong Hao and Edward J. McCluskey "Resistive Shorts" within CMOS Gates, 1991.

Hong Hao and Edward J. McCluskey Very-Low-Voltage Testing for Weak CMOS Logic ICs, 1993.

Hong Hao and Edward J. McCluskey Analysis of Gate Oxide Shorts in CMOS Circuits, 1993.

Charles F. Hawkins and Jerry M. Soden Electrical Failure Mode Characterization in CMOS ICs.

Jerry M. Soden, Charles F. Hawkins & Anthony C. Miller Identifying defects in deep-submicron CMOS ICs, 1996.

Jerry M. Soden, Charles F. Hawkins, Ronald R. Fritzemeier & Luther K. Horning Quiescent Power Supply Current Measurement for CMOs IC Defect Detection, 1989.

Doug Josephson, Mark Storey, Dan Dixon, Hewlett-Packard Microprocessor IDDQ Testing: A Case Study, 1995.

Ali Keshavarzi, Kaushik Roy, Manoj Sachdev, Charles F. Hawkins, K. Soumyanath, Vlvek De Multiple-Parameter CMOS IC Testing with Increased Sensitivity for IDDQ, 2000.

Bram Kruseman, Stefan van den Oetelaar, and Josep Rius Comparisons of IDDQ Testing and Very-Low Voltage Testing, 2002.

Boris Lisenker and Yuri Mitnick Fault Model for VLSI Circuits Reliability Assessment, 1999.

Boris Lisenker, Dmitry Veinger and Yuri Mitnick Short High Voltage Stress for Design-to-Process Characterization, 1999.

Phil Nigh and Anne Gattiker Test Method Evaluation Experiments & Data, 2000.

Phil Nigh, Dave Vallett, Atul Patel & Jason Wright Failure Analysis of Timing and IDDQ-only Failures from the SEMATECH Test Methods Experiment, 1998.

Alan W. Righter, Charles F. Hawkins, Jerry M. Soden, Peter Maxwell CMOS IC Reliability Indicators and Burn-In Economics, 1998.

R. Rodriguiz-Montanes, J.A. Segura, V.H.Champac, J. Figueras, J.A. Rubio Current vs. Logic Testing of Gate Oxide Short, Floating Gate and Bridging Failures in CMOS, 1991.

Michael Rubin, David Leary and Saul Natan Yield Enhancement and Yield Management of Silicon Foundries Using IDDQ "Stress Current Signature", 2001.

Yasuo Sato, Masaki Kohno, Toshio Ikeda, Iwao Yamazaki, & Masato Hamamoto An Evalution of Defect-Oriented Test: WELL-controlled Low Voltage Test, 2001 IEEE.

Chao-Wen Tseng, Ray Chen, Phil Nigh & Edward J. McCluskey MINVDD Testing for Weak CMOS ICs, 2001 IEEE.

T.J. Vogels Effectiveness of I-V Testing in Comparison to IDDQ Tests, 2003 IEEE.

* cited by examiner

METHOD AND SYSTEM FOR DEFECT EVALUATION USING QUIESCENT POWER PLANE CURRENT (IDDQ) VOLTAGE LINEARITY

BACKGROUND OF THE INVENTION

1. Field of the Invention

The present invention generally relates to integrated circuit test systems, and more particularly to a computer program that analyzes voltage dependency of integrated circuit power supply pin quiescent current measurements.

2. Description of Related Art

Manufacturing tests and design verification tests are necessary for ensuring functionality and reliability of large-scale digital integrated circuits such as Very Large Scale Integration (VLSI) circuits. Millions of transistors and logic gates are often combined on a single die and the performance of the die is verified both in the design phase and the manufacturing phase of a VLSI product cycle.

Power supply current for individual gates or blocks within such a VLSI circuit combines to generate the power requirements for the overall die, and will typically combine in sub-groups to several power and ground pins that are typically also connected within the integrated circuit package. Faults within a VLSI circuit are generally caused by short circuit paths or open circuit paths in conductor or semiconductor segments and as device and line size is decreased in order to increase transistor count, a tolerable defect level is established by a manufacturer. Post-manufacture testing is performed, generally at the wafer level, in order to avoid packaging defective devices.

One test that has proven very efficient for determining whether short circuit faults exists in semiconductor dies is a quiescent supply current test (or IDDQ test). IDDQ testing is typically performed by measuring the leakage current through the power supply plane (sum of the power pin or return pin currents, i.e., IDDQ) using a manufacturing tester parametric (analog) measurement capability. A series of test vectors are used to exercise internal states of the integrated circuit and the IDDQ measurements are used to discover states in which an internal short is activated (for example, a short to ground on the output of an inverter raises IDDQ when the input of the inverter is set to a known low state by the test vector pattern).

However, the shorting resistance in short-circuit failures may be relatively high compared to the output circuit resistance and thus a particular short may not be a significant defect requiring rejection of a die. Additionally, a particular test acceptance current level (even on a per-vector basis) may cause rejection of dies that will not exhibit faults because the particular output circuit resistance is low with respect to the shorting resistance. Such a test may also pass dies that will exhibit faults, which may be logic value failures or unacceptable signal delays. Faults may be missed as the output circuit resistance may be so high that even a high shorting resistance that does not appear to significantly affect IDDQ may cause operational failures. Such fault missing may cause parts to be shipped that may exhibit failures in end-user installations, or at least will cost further test time and/or further packaging process cost that could be avoided if the defect could be detected prior to functional testing.

As the output resistance of various gates within a typical VLSI circuit may vary by as much as 100:1, variations in shorting resistance and short location cause some significant defects to be easily masked, while other defects that will not affect the functionality of the die may cause waste due to unnecessarily rejected dies.

Therefore, it is be desirable to implement an improved IDDQ testing methodology that can distinguish between shorts that are likely to cause functional failures and those that will not. It would further be desirable to provide an IDDQ testing methodology that can detect high-resistance shorts that will cause functional failures and detect relatively low-resistance shorts that will not cause functional failures.

SUMMARY OF THE INVENTION

The objective of providing an improved IDDQ testing algorithm that distinguishes between shorts that will cause functional failures and shorts that will not is provided in a method and system for performing voltage-dependent IDDQ testing that detects an onset of non-linear behavior of IDDQ versus VDD in order to determine the relative magnitude of the shorting resistance and the driving resistance.

The method reads or collects a data set of quiescent power plane current (IDDQ) values over multiple power plane voltages for a VLSI device set to a known state by a test vector. The test vector may be selected as a test vector known to activate a defect forming a short that adds leakage to the power plane current. The method then examines the slope of the IDDQ current vs. power-plane voltage curve in order to determine a range of power-plane voltages for which the IDDQ current/voltage dependency is non-linear. If a linear region is detected (corresponding to a defect activated by the test vector), the size of the non-linear region (or alternatively the linear region) is measured in order to determine the magnitude of the defect resistance relative to the driving resistance of the output circuit where the defect is located. A pass/fail manufacturing test may be implemented by comparing the measured non-linearity range to an allowable range, and if the range is larger than an allowable range, the device is rejected.

IDDQ vs. VDD data may be obtained for another test vector that does not activate the defect and the IDDQ values for each VDD value are subtracted from the data for the test vector that activates the defect. The differences are then analyzed for onset of non-linearity and if the region of non-linearity exceeds a threshold, the part is rejected. Onset of non-linearity can be determined by detecting a peak in the first derivative of the IDDQ vs. VDD curve.

In general, if the slope of the IDDQ vs. VDD data does not change, any activated defect is so insubstantial that it is unlikely to affect circuit performance. If the slope changes over the entire range of voltages, a defect is present that is generally unacceptable. If the slope is constant and then begins to change below one voltage point, then the defect activated by the vector may cause failure and the severity of the defect is indicated by the range of voltages for which the IDDQ curve is non-linear.

The invention may be further embodied in a manufacturing tester or general-purpose computer executing program instructions for carrying out the steps of the method, and in a computer program product having a storage media for encoding the program instructions.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

Figure 1:
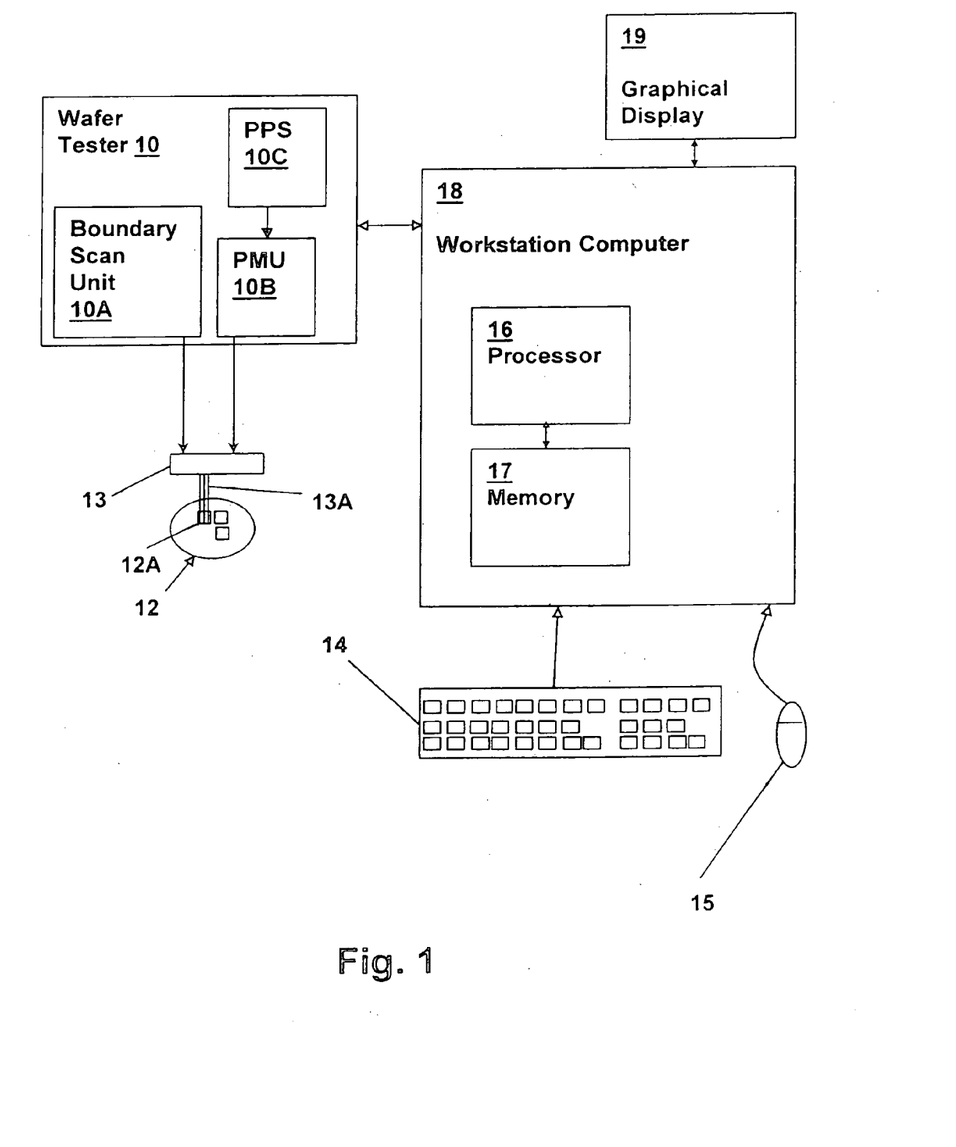
FIG. 1 is a pictorial diagram of a manufacturing tester connected to a device under test by methods in accordance with an embodiment of the present invention.

Referring to the figures, and particularly to FIG. 1, a VLSI wafer test system, in which methods according to an embodiment of the present invention are performed, is depicted. A wafer tester 10 includes a boundary scan unit 10A for providing stimulus to a die 12A on a wafer under test 12, via a probe head 13 having electrical test connections 13A to die 12A. Wafer tester 10 also includes a parametric measurement unit (PMU) 10B, also coupled to die 12A via probe head 13 via electrical test connections 13A that can measure analog parameters such as the power plane current (IDDQ) as measured in accordance with the methods of the present invention. Wafer tester 10 further includes a programmable power supply (PPS) 10C that provides for programming multiple differing power plane voltages (VDDS) and is coupled to PMU 10B so that the power supply current supplied by PPS 10C can be measured by PMU 10B. IDDQ measurements are performed over a series of test vectors stimulated by boundary scan unit 10A and after a delay for permitting the current to settle to a quiescent state, PMU 10B provides a measurement of IDDQ for each vector. When a vector is detected for which the measured IDDQ indicates that a fault is active, the power plane voltage (VDD) is programmed to a set of discrete levels and IDDQ measurements are taken at each level. In general, shorts are the most common defect type present in a device, and shorts that produce delays only (e.g., shorts that would allow a device to operate, but below its rated speed) are increasingly a problem in present-day devices.

A workstation computer 18, having a processor 16 coupled to a memory 17, for executing program instructions from memory 17, wherein the program instructions include program instructions for executing one or more methods in accordance with an embodiment of the present invention, is coupled to wafer tester 10, whereby IDDQ measurement for a die over a plurality of test vectors and a plurality of voltages for those vectors that indicate the presence of an active fault are collected and stored in memory 17 and/or other media storage such as a hard disk. Workstation computer 18 is also coupled to a graphical display 19 for displaying program output such as the current vs. voltage graphs provided by embodiments of the present invention. Workstation computer 18 is further coupled to input devices such as a mouse 15 and a keyboard 14 for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 18. Further, workstation computer 18 may be coupled to wafer tester by such a network connection.

While the system of FIG. 1, depicts a configuration suitable for sequential test of a plurality of dies on a wafer, the depicted system is illustrative and not limiting to the present invention. Probe head 13 may be a multi-die full wafer probe system, or may comprise multiple probe heads for simultaneously testing multiple wafers on a single or multiple die basis. Additionally, while boundary scan vector injection is illustrated, the techniques of the present invention may also be applied to test patterns generated internally by die 12A including the execution of test code from a processor incorporated on die 12A, or test patterns generated by connection of die 12A to a stimulus source other than boundary scan unit 10A, for example, a dedicated exerciser logic.

Figure 2:
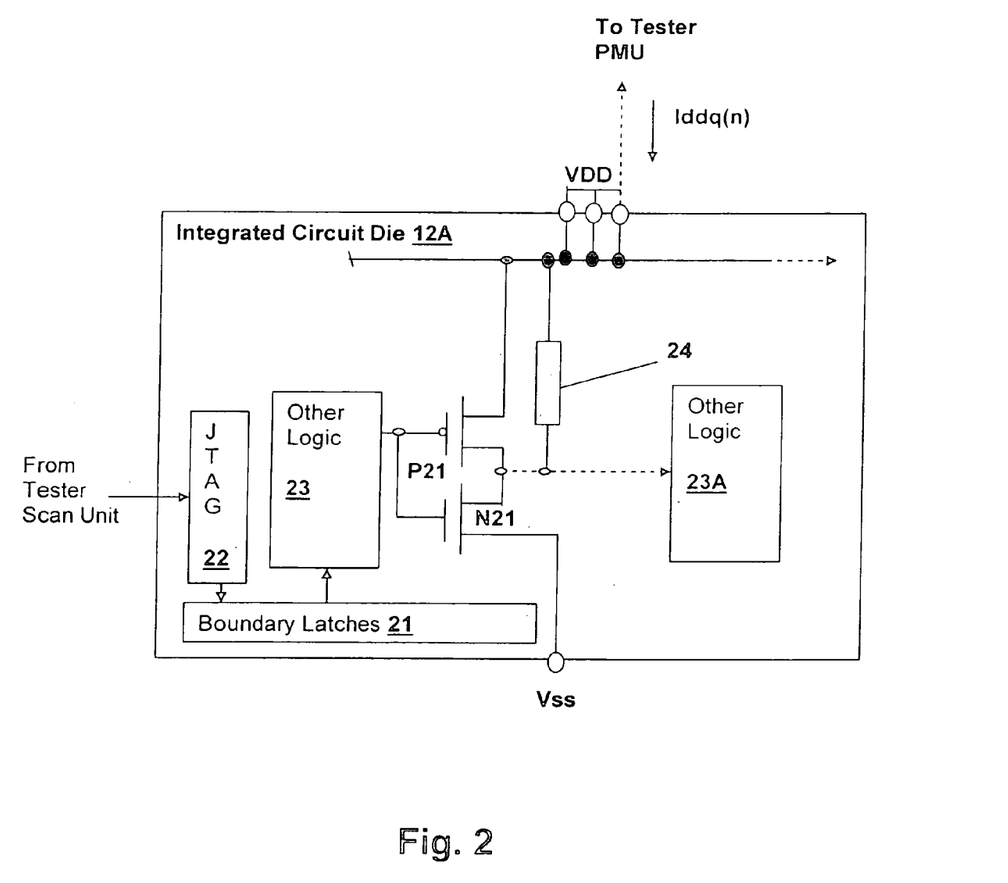
FIG. 2 is a schematic diagram depicting details of the device under test of FIG. 1.

Referring now to FIG. 2, a block diagram of a simplified integrated circuit die 12A for illustrating the methods of the present invention is shown. The power supply current $I_{ddq}(n)$ for the combined power plane of die 12A is measured as die 12A is stimulated from Joint Test Action Group (JTAG) interface 22, which sets boundary latches 21 that set internal states of integrated circuit die 12A. Other logic 23 may be present between boundary latches 23 and logic that activates a defect 24, depicted as a shorting resistance 24 between the power supply rail and the output of a logical CMOS inverter formed by transistors P21 and N21. When the gates of transistors N21 and P21 are inactive (low), resistance 24 will not cause a significant rise in IDDQ. However, when the gates of transistors N21 and P21 are active (high), resistance 24 will cause a rise in IDDQ by conducting current from the power supply rail to ground through transistor N21. The above-described circuit is illustrative of a defect (short) that is activated by all states in which the input of the inverter is active (i.e., the gates of transistors N21 and P21 are the logical high voltage state). More complex faults are also detectable via IDDQ rise, such as shorts between logical circuit nodes that become active when the nodes are in different states and semi-conducting shorts that are active only for particular states and polarity. Shorting resistance 24 affects the delay and/or logic level of signals transmitted by the inverter formed by transistors P21 and N21 to other logic circuits 23A.

Depending on the relative resistance of transistor N21 to shorting resistance 24, shorting resistance 24 may or may not cause a logic level transmission fault to other logic circuits 23A (i.e., an incorrect logic state within other logic circuits 23A for the low level logic state of the inverter due to too high a voltage at the inverter output caused by shorting resistance 24.) In all cases, shorting resistance 24 causes a delay increase for the transition to the logic low state of the inverter. The above-described delay variation may cause a functional failure of die 12A. If the resistance of shorting resistance 24 is relatively high with respect to the driving circuit resistance (i.e., the on state equivalent resistances of transistors N21 and P21), then the delay variation will be negligible. The present invention provides a methodology for determining the relative resistance of a shorting resistance defect to the driving-point resistance without knowing where the fault is located, and thus permits selective rejection of dies based on the relative resistance rather than absolute current magnitude. Without the ability to determine relative resistance of a fault, an IDDQ test may falsely indicate a severe defect for high fault leakage current causing unacceptable rejection of functional dies or indicate a non-severe defect for low fault leakage current causing non-functional devices to pass an IDDQ test.

The size of the non-linear region of the IDDQ vs. VDD curve presents a measure of the relative resistances of the driving transistor(s) and the defect resistance, as the transistor equivalent on-resistance is non-linear with Vds and Vgs. As VDD is decreased, the equivalent resistance of the transistor increases, but the resistance of the defect remains the same. When the defect resistance is high with respect to the resistance of the transistor (a benign defect), the IDDQ for the circuit will be substantially linear throughout the range of applied VDD. When the magnitude of the defect resistance is on the order of the magnitude of the transistor equivalent resistance, there will be a transition in the slope of the IDDQ vs. VDD curve from linear at higher VDDs where the defect resistance represents the majority of the total resistance to non-linear at lower VDDs where the transistor resistance predominates. Moreover, the higher the defect resistance relative to the transistor equivalent resistance, the lower the voltage will be at the point of transition from linear to non-linear relationship between IDDQ and VDD. Therefore, smaller ranges of non-linearity (and consequent greater ranges of linearity) indicate defects that will have less effect on circuit performance. The position of the change in linearity, is therefore an indicator of the resistance of a short with respect to the transistor equivalent resistance and therefore the severity of the defect. Finally, if the defect resistance is significantly lower than the transistor equivalent resistance, the IDDQ vs. VDD curve will be non-linear throughout the VDD range and if the defect resistance is significantly higher, the curve will be linear throughout the VDD range. The present invention determines the range in which the IDDQ vs. VDD curve is linear and uses that metric to determine which devices are acceptable and which devices should be rejected. As described above, the size of the linear range of the IDDQ vs. VDD curve is a measure of the key factor of a defect's severity: the relative resistance of the defect with respect to the circuit driving point resistance (the transistor equivalent resistance).

Figure 3:
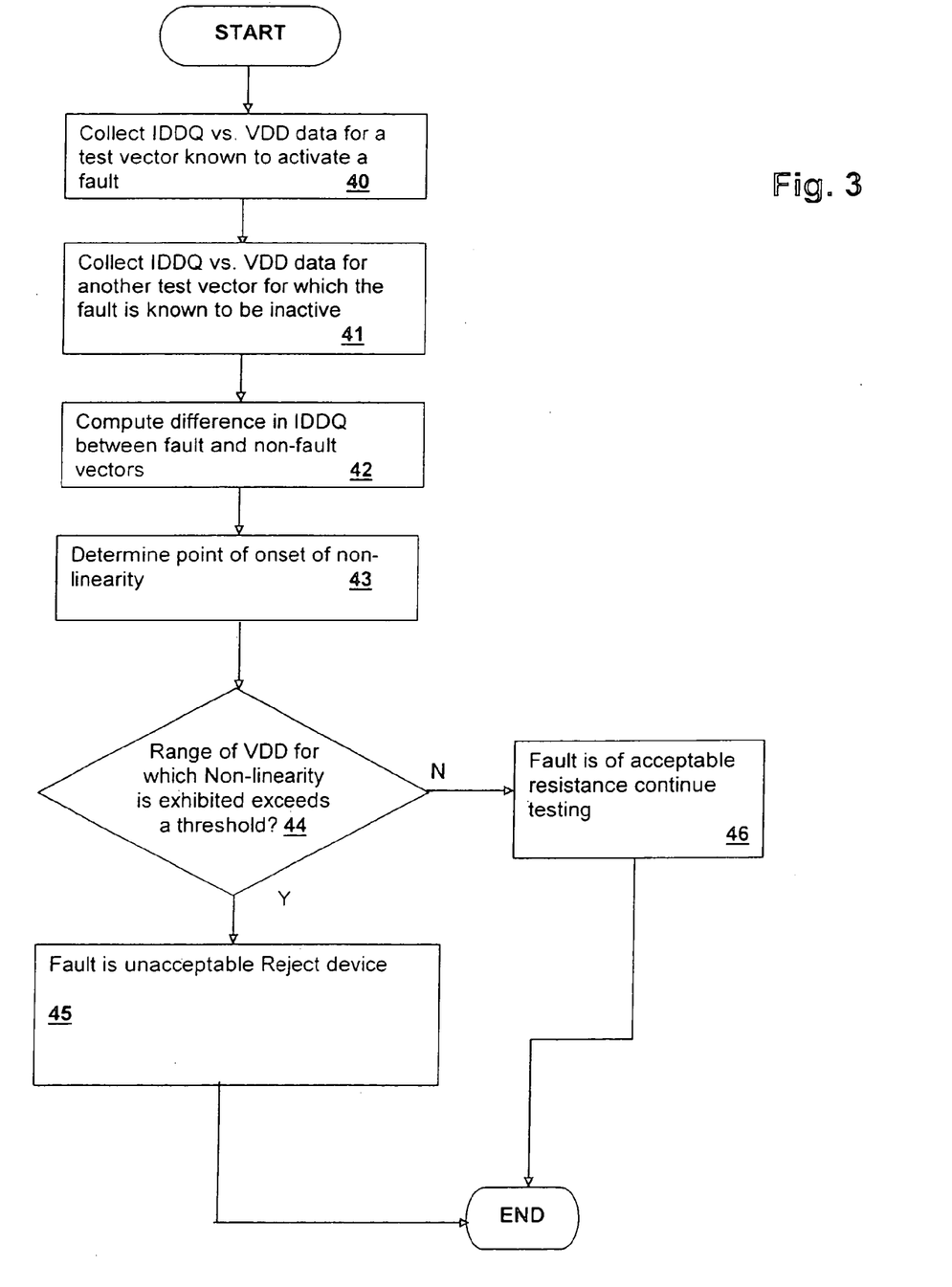
FIG. 3 is a flow chart depicting a method in accordance with an embodiment of the present invention.

Referring now to FIG. 3, a method in accordance with an embodiment of the present invention is depicted in a flowchart. Upon detecting a vector that indicates the presence of an activated fault, (e.g., IDDQ exceeds a threshold or is otherwise detected as not matching an acceptable IDDQ value for the test vector), IDDQ data is collected over multiple programmed VDD values for that vector (step 40). Next, IDDQ data may be collected for another vector that is known to not activate any fault (e.g., the minimum IDDQ vector for the die) over the same set of VDD values (step 41). Then the differences between IDDQ for the fault-activating vector and the non-fault-activating vector are subtracted to normalize the IDDQ values (step 42). (Subtraction of background current level is especially useful in testing devices manufactured using sub-micron processes, as background leakage levels may be as great as or greater than a defect-related current.) Next, the VDD vs. IDDQ data is then examined to determine the VDD voltage below which the IDDQ vs. VDD curve becomes non-linear, if any non-linearity is detectable (step 43). If the range of VDD for which the non-linearity is exhibited is greater than a threshold (decision 44) then the die is rejected (step 45). Otherwise the defect is determined to be acceptable and the die is accepted or testing is resumed (step 46). The non-linearity detection of step 43 may be performed by detecting peaks in the first derivative of the IDDQ data taken over the set of VDD voltages.

Figure 4A:
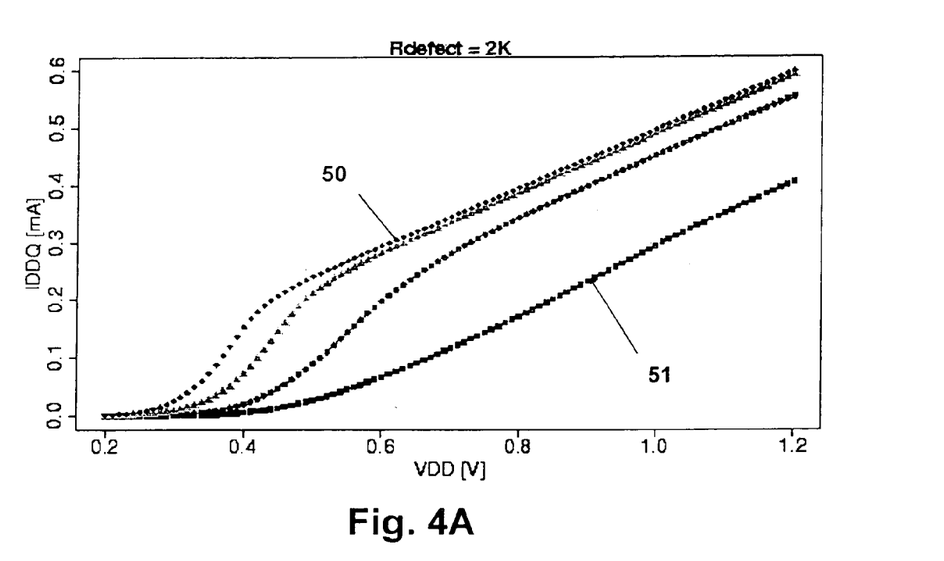
FIG. 4A–4C are graphs depicting results of a method in accordance with an embodiment of the present invention.
Figure 4B:
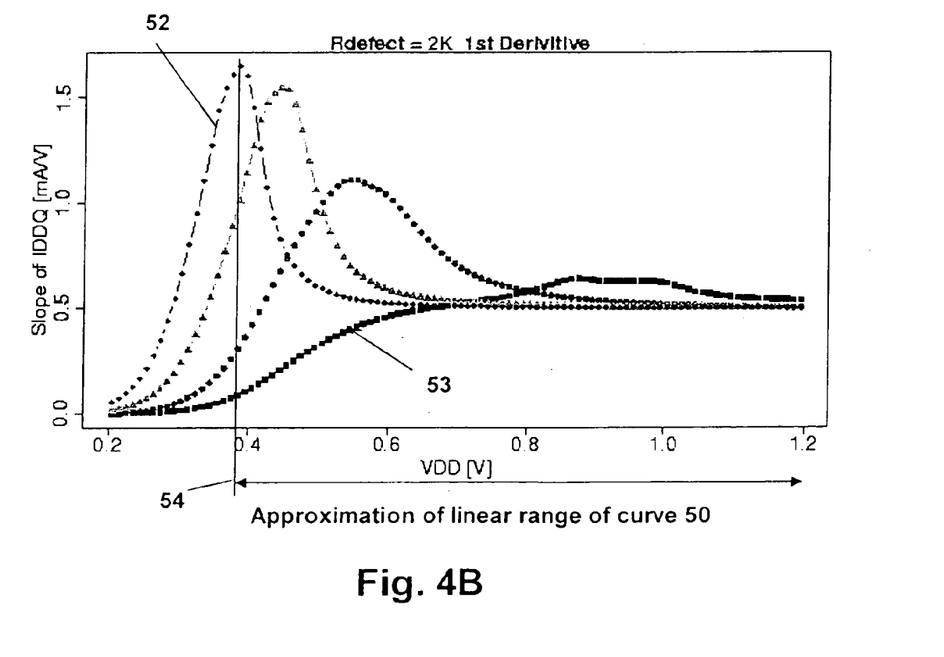
Figure 4C:
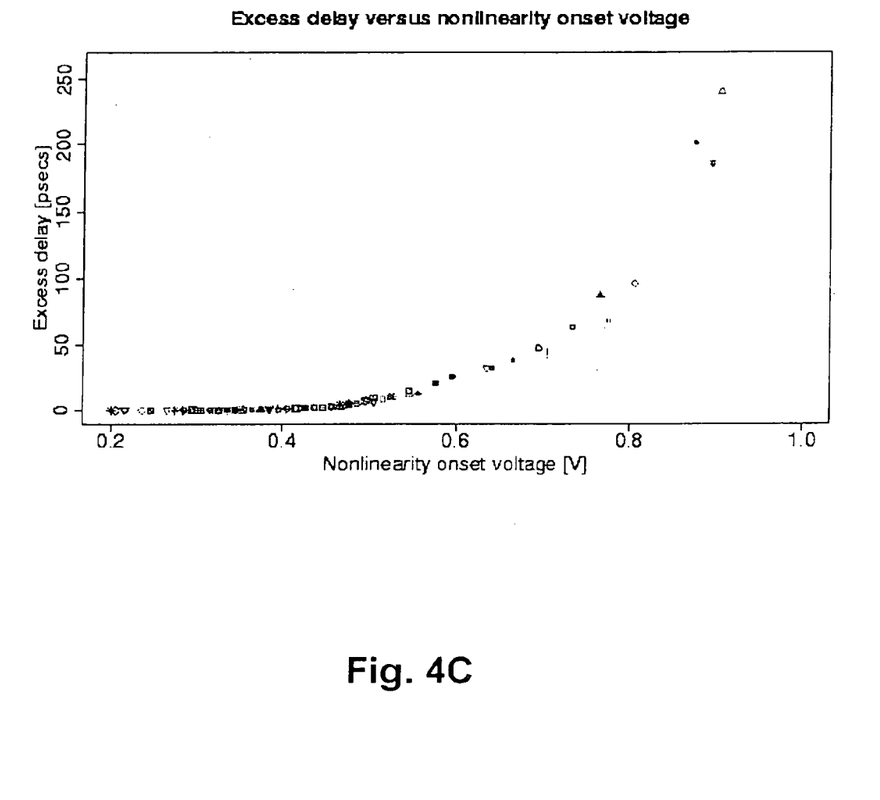

Referring now to FIGS. 4A–4C, graphs illustrating the advantages of the present invention are depicted. FIG. 4A depicts simulated IDDQ versus VDD voltage test data for devices having a logic gate (inverter) with differing output resistances, where in each case the logic gate is affected by a defect of a predetermined resistance (in the depicted case, a 2000 Ohm resistance at the inverter output). The top curve 50 corresponds to a "strong" gate (i.e., a gate having a relatively low output resistance) for which the defect causes a very short (insignificant) delay, while the bottom curve 51 corresponds to a "weak" gate (i.e., a gate having a relatively high output resistance) for which the defect causes a long delay that will likely cause the shorted circuit to fail (e.g., the circuit will not operate at its rated speed or clock frequency). The curves in between the top and bottom curves represent defect/gate resistance relationships that are in-between the above-described "strong" and "weak" gate examples. Counter to normal IDDQ testing philosophy, it is apparent that the die most severely affected by the defect (having a weak gate driving the defective node) has a lower IDDQ value overall, while the die least affected by the defect (having a strong gate driving the defective node) has a higher IDDQ value. Therefore, IDDQ magnitude-only testing cannot make the distinctions possible using the methodology of the present invention.

FIG. 4B depicts the first derivative of the IDDQ curves of FIG. 4A. The peaks of each curve can be used as an approximation of the VDD point of onset of non-linearity. The bottommost curve 53 at the left of the graph (corresponding to the first derivative of curve 51 of FIG. 4A) has a peak at approximately VDD=0.9V, exemplifying a device for which the non-linear range is large. For some defects, the non-linear region may extend throughout the entire measured voltage interval, in which case no peak may be observed in the first derivative. The curve 52 having the leftmost peak corresponds to the top curve 50 of FIG. 4A, and indicates an onset of non-linearity 54 at the lowest VDD voltage of any of the curves. The linear range indicated for curve 50 is thus the largest linear range; curve 51 has the smallest linear range. The VDD position of the peak of the first-derivative curve can be detected (by taking the second derivative or by other means) and used to determine a VDD range over which the TDDQ vs. VDD performance is linear. A threshold above which the IDDQ curve remains non-linear can then be used as a pass/fail threshold for rejecting dies. In general, a threshold will also be applied to the first derivative peak-detection algorithm, so that numerical or measurement noise does not cause a false indication of a change in linearity.

Referring now to FIG. 4C, a graph depicting the relationship of excess delay (caused by a shorting resistance) to the IDDQ non-linearity onset voltage for the logic gates exemplified in FIG. 4A and a wide range of shorting resistance. There is an inverse relationship between the range for which VDD is linear and the excess delay caused by the defect, as the non-linearity onset voltage represents the VDD above which the resistance of the driving-point transistor plus the defect resistance is dominated by the defect resistance. The lower the defect resistance, the lower the output resistance of the driving gate must be so that linear behavior is observed in the IDDQ vs. VDD curve. Thus for lower defect resistances, linearity is either never exhibited or is exhibited at relatively high VDD voltage compared to a high resistance defect at the same node.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for evaluating a shorting defect in an integrated circuit, said method comprising:
   reading a plurality of quiescent power-plane current values at a plurality of corresponding power-plane voltages for a test vector for which said shorting defect is activated;
   detecting a change in linearity of said plurality of power-plane current values with respect to said power-plane voltages;
   determining a particular power-plane voltage above which said detecting detects that said plurality of power-plane current values are linear with respect to said power plane voltages; and
   evaluating a level of severity of said shorting defect, wherein said level is determined in conformity with a value of said particular power-plane voltage.

2. The method of claim 1, further comprising:
   computing a first derivative of said quiescent power-plane current values at multiple ones of said power-plane voltages; and
   detecting a peak value of said computed first derivative, and wherein said determining determines a said particular power plane voltage as a voltage corresponding to said peak value.

3. The method of claim 1, further comprising:
   second reading a second plurality of quiescent power-plane current values at said plurality of power-plane voltages for a second test vector for which said shorting defect is not activated; and
   subtracting said second plurality of quiescent power-plane current values from said plurality of quiescent power-plane current values read by said reading, whereby said plurality of quiescent power-plane current values are normalized, and wherein said detecting is performed on said normalized quiescent power-plane current values.

4. The method of claim 3, further comprising selecting a second test vector as a vector having a lowest power-plane quiescent current value at a predetermined operating voltage from among a set of test vectors.

5. The method of claim 1, wherein said evaluating comprises:
   determining whether or not a power-plane voltage corresponding to said change in linearity is above a predetermined threshold; and
   in response to determining that voltage is above said predetermined threshold, rejecting said integrated circuit as a failure.

6. The method of claim 1, further comprising selecting said test vector as a vector having a highest power-plane quiescent current value at a predetermined operating voltage from among a set of test vectors.

7. A computer program product for use with a workstation computer, wherein said computer program product comprises signal bearing media containing program instructions for execution within said workstation computer for evaluating a shorting defect in an integrated circuit, wherein said program instructions comprise program instructions for:
   reading a plurality of quiescent power-plane current values at a plurality of corresponding power-plane voltages for a test vector for which said shorting defect is activated;
   detecting a change in linearity of said plurality of power-plane current values with respect to said power-plane voltages;
   determining a particular power-plane voltage above which said program instructions for detecting detect that said plurality of power-plane current values are linear with respect to said power-plane voltages; and
   evaluating a level of severity of said shorting defect, wherein said level of severity is determined in conformity with said particular power-plane voltage.

8. The computer program product of claim 7, wherein said program instructions further comprise program instructions for:
   computing a first derivative of said quiescent power-plane current values at multiple ones of said power-plane voltages; and
   detecting a peak value of said computed first derivative, and wherein said program instructions for determining determine said particular power plane voltage as a voltage corresponding to said peak value.

9. The computer program product of claim 7, wherein said program instructions further comprise program instructions for:
   second reading a second plurality of quiescent power-plane current values at said plurality of power-plane voltages for a second test vector for which said shorting defect is not activated; and
   subtracting said second plurality of quiescent power-plane current values from said plurality of quiescent power-plane current values read by said reading, whereby said plurality of quiescent power-plane current values are normalized, and wherein said program instructions for detecting operate on said normalized quiescent power-plane current values.

10. The computer program product of claim 9, wherein said program instructions further comprise program instructions for selecting a second test vector as a vector having a lowest power-plane quiescent current value at a predetermined operating voltage from among a set of test vectors.

11. The computer program product of claim 7, wherein said program instructions for evaluating comprise program instructions for:
    determining whether or not a power-plane voltage corresponding to said change in linearity is above a predetermined threshold; and
    in response to determining that voltage is above said predetermined threshold, rejecting said integrated circuit as a failure.

12. The computer program product of claim 7, wherein said program instructions further comprise program instructions for selecting said test vector as a vector having a highest power-plane quiescent current value at a predetermined operating voltage from among a set of test vectors.

13. A workstation comprising:
    a memory for storing program instructions and data values for evaluating a shorting defect in an integrated circuit;
    a processor for executing said program instructions, wherein said program instructions comprise program instructions for:
    reading a plurality of quiescent power-plane current values at a plurality of corresponding power-plane voltages for a test vector for which said shorting defect is activated;
    detecting a change in linearity of said plurality of power-plane current values with respect to said power-plane voltages;
    determining a particular power-plane voltage above which said program instructions for detecting detect that said plurality of power-plane current values are linear with respect to said power-plane voltages; and evaluating a level of severity of said shorting defect, wherein said level of severity is determined in conformity with said particular power-plane voltage.

14. The workstation of claim 13, wherein said program instructions further comprise program instructions for:
   computing a first derivative of said quiescent power-plane current values at multiple ones of said power-plane voltages; and
   detecting a peak value of said computed first derivative, and wherein said program instructions for determining determine said particular power-plane voltage as a voltage corresponding to said peak value.

15. The workstation of claim 13, wherein said program instructions further comprise program instructions for:
   second reading a second plurality of quiescent power-plane current values at said plurality of power-plane voltages for a second test vector for which said shorting defect is not activated; and
   subtracting said second plurality of quiescent power-plane current values from said plurality of quiescent power-plane current values read by said reading, whereby said plurality of quiescent power-plane current values are normalized, and wherein said program instructions for detecting operate on said normalized quiescent power-plane current values.

16. The workstation of claim 15, wherein said program instructions further comprise program instructions for selecting a second test vector as a vector having a lowest power-plane quiescent current value at a predetermined operating voltage from among a set of test vectors.

17. The workstation of claim 13, wherein said program instructions for evaluating comprise program instructions for:
   determining whether or not a power-plane voltage corresponding to said change in linearity is above a predetermined threshold; and
   in response to determining that voltage is above said predetermined threshold, rejecting said integrated circuit as a failure.

18. The workstation of claim 13, wherein said program instructions further comprise program instructions for selecting said test vector as a vector having a highest power-plane quiescent current value at a predetermined operating voltage from among a set of test vectors.

* * * * *